United States Patent
Wu et al.

(10) Patent No.: US 10,197,604 B2
(45) Date of Patent: Feb. 5, 2019

(54) CURRENT DETECTING APPARATUS

(71) Applicant: DELTA ELECTRONICS, INC., Taoyuan (TW)

(72) Inventors: Chun-Wei Wu, Taoyuan (TW); Xin-Hung Lin, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 15/654,021

(22) Filed: Jul. 19, 2017

(65) Prior Publication Data
US 2018/0074098 A1    Mar. 15, 2018

(30) Foreign Application Priority Data

Sep. 14, 2016    (TW) .............................. 105129922 A (51) Int. Cl.
*G01R 19/165*    (2006.01)
*G01R 19/00*    (2006.01)
(Continued)

(52) U.S. Cl.
CPC ........... *G01R 19/165* (2013.01); *G01R 19/00* (2013.01); *G01R 19/0015* (2013.01);
(Continued)

(58) Field of Classification Search
CPC ...... G01R 19/165; G01R 19/16538–19/16552; G01R 19/16566–19/16595; G01R 19/18–19/22; G01R 19/0069; H02H 7/09
See application file for complete search history.

(56) References Cited

U.S. PATENT DOCUMENTS

| 6,111,767 A * | 8/2000 | Handleman ............... G05F 1/67 136/293 |
| 6,549,081 B1 * | 4/2003 | Le ........................ H03K 3/0231 324/750.3 |

(Continued)

FOREIGN PATENT DOCUMENTS

| JP | H11-299251 | 10/1999 |
| JP | 2013-002915 | 1/2013 |
| JP | 2014-190972 | 10/2014 |

OTHER PUBLICATIONS

The extended European search report dated Feb. 8, 2018 from corresponding application No. EP 17183538.2.
(Continued)

*Primary Examiner* — Thomas J. Hiltunen
(74) *Attorney, Agent, or Firm* — Hauptman Ham, LLP (57) ABSTRACT

A current detecting apparatus measures an input current or an output current of an electronic apparatus. The current detecting apparatus includes a current detecting module, a direct-current measurement module and a current detecting module. The current detecting module includes a coil configured to electromagnetically couple to a path of an input or a path of an output of the electronic apparatus to obtain a first voltage signal. The direct-current measurement module measures the path of the input or the path of the output to obtain a second voltage signal. The current detecting module converts the first voltage signal into a first current command, and converts the second voltage signal into a second current command. The first current command is an alternating-current component of the input current or the output current. The second current command is a direct-current component of the input current or the output current.

14 Claims, 8 Drawing Sheets

(51) Int. Cl.
  *G01R 19/18* (2006.01)
  *H02H 7/09* (2006.01)
  *H02P 27/06* (2006.01)

(52) U.S. Cl.
  CPC ......... *G01R 19/0069* (2013.01); *G01R 19/18* (2013.01); *H02H 7/09* (2013.01); *H02P 27/06* (2013.01)

(56) References Cited

U.S. PATENT DOCUMENTS

| | | | | |
|---|---|---|---|---|
| 8,000,912 B2* | 8/2011 | Choi | ...................... | G01R 21/06 702/60 |
| 9,853,538 B2* | 12/2017 | Adest | ...................... | H02M 3/04 |
| 2010/0202168 A1* | 8/2010 | Kanno | ...................... | H02J 9/062 363/37 |
| 2010/0302825 A1* | 12/2010 | Ohshima | ........... | H02M 7/53871 363/131 |
| 2012/0268063 A1* | 10/2012 | Qiu | ........................ | H02J 7/022 320/107 |
| 2013/0015830 A1* | 1/2013 | Zhang | ..................... | H02M 1/14 323/282 |
| 2013/0113279 A1* | 5/2013 | Hatanaka | .................. | B60L 9/22 307/9.1 |
| 2013/0215652 A1* | 8/2013 | Komatsu | ................. | H02J 3/386 363/37 |
| 2014/0217998 A1* | 8/2014 | Krueger | ..................... | G05F 1/46 323/273 |
| 2014/0253108 A1 | 9/2014 | Singh et al. | | |
| 2014/0253109 A1 | 9/2014 | Singh et al. | | |
| 2015/0055261 A1* | 2/2015 | Lubicki | .................. | H02H 9/025 361/91.1 |
| 2016/0126863 A1* | 5/2016 | Ayai | ...................... | H02M 1/126 363/132 |

OTHER PUBLICATIONS

Office Action dated Jun. 19, 2018 from corresponding application No. JP 2017-147712.

\* cited by examiner

FIG. 1A
RELATER ART

FIG. 1B
RELATER ART

CURRENT DETECTING APPARATUS

CROSS-REFERENCE TO RELATED APPLICATION

This application claims priority to Taiwan Patent Application No. 105129922 filed on Sep. 14, 2016, which is incorporated by reference herein.

BACKGROUND OF THE INVENTION

Field of the Invention

The present invention relates to a current detecting apparatus and an operation method for the same, and especially relates to a current detecting apparatus which can measure the magnitude of the input current or the magnitude of the output current without any semiconductor components, and an operation method for the same.

Description of the Related Art

Figure 1A:
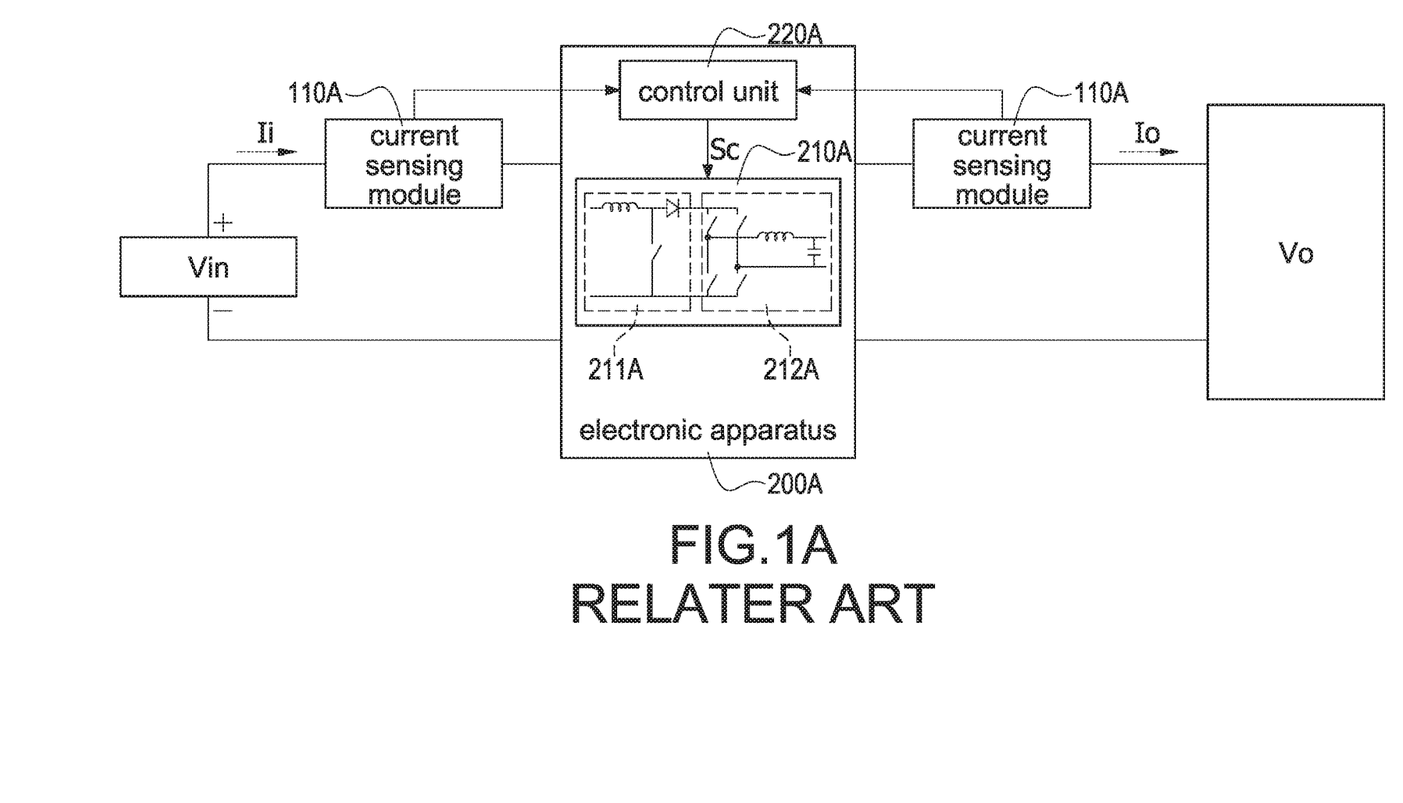
FIG. 1A shows a block diagram of a related art current detecting apparatus.

FIG. 1A shows a block diagram of a related art current detecting apparatus. As shown, an electronic apparatus 200A comprises a conversion module 210A and a control unit 220A. The conversion module 210A comprises a conversion unit 211A and an inverter unit 212A, which are controlled by the control unit 220A. The conversion unit 211A is a boost conversion module, the inverter unit 212A is a one-phase inverter module. A current sensing module 110A is arranged at the input or the output of the electronic apparatus 200A to measure the magnitude of the input current Ii and the magnitude of the output current Io of the electronic apparatus 200A. The current detecting module 110A informs the control unit 220A of the magnitude of the input current Ii and the output current Io to adjust a control signal Sc outputted by the control unit 220A. Currently, Hall current sensors are usually used to measure the input current Ii and the output current Io.

Figure 1B:
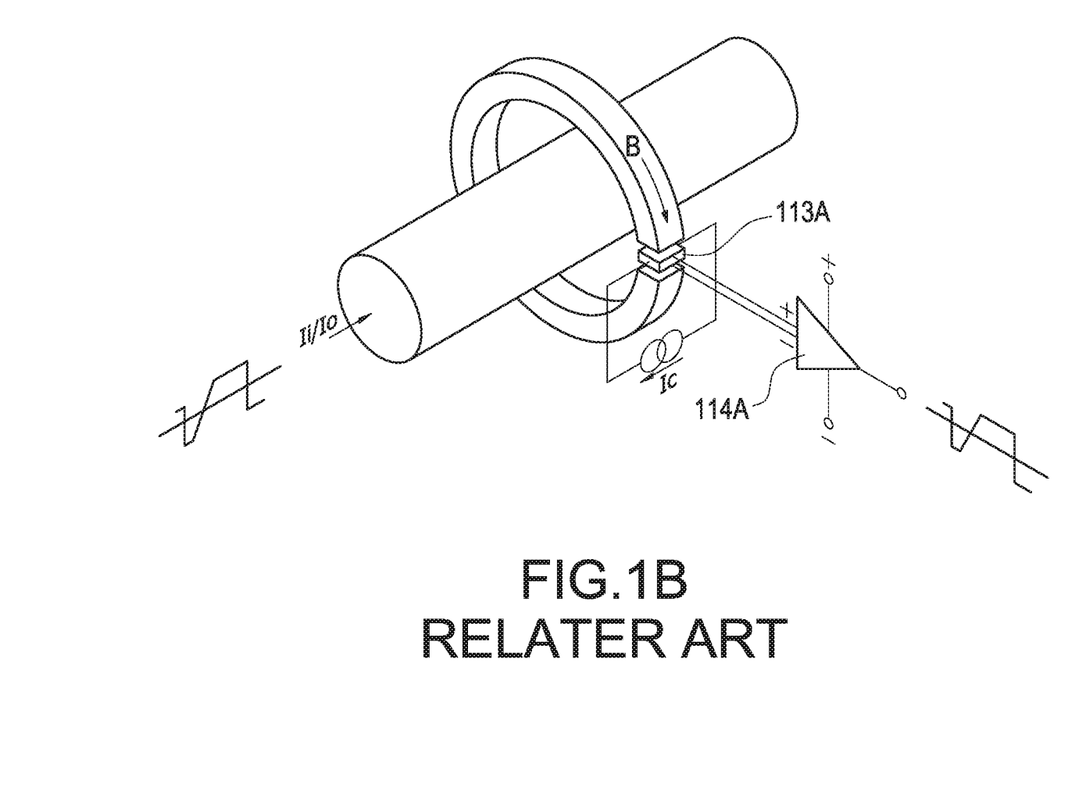
FIG. 1B shows a structure diagram of a related art current sensing module.

FIG. 1B shows a structure diagram of a related art current sensing module. The current sensing module 110A is a Hall current sensor. When the input current Ii or the output current Io flows through the primary loop, the magnetic line B generates the Hall voltage. Utilizing the Hall effect principle, the Lorentz force is generated by the magnetic line B and is vertically applied to the moving electric charges by a control current Ic longitudinally flowing through a semiconductor wafer 113A of the current detecting module 110A. The semiconductor wafer 113A generates a potential difference ΔV to calculate the current. Then, an amplifier module 114A adjusts a magnification of the potential difference ΔV to provide to the control unit 220A. The control unit 220A adjusts the control signal Sc according to the magnitude of the input current Ii and the output current Io measured by the current sensing module 110A. The current sensing module 110A is mainly the semiconductor applied to the Hall effect, and uses Ge, Si, InSb, GaAs, InAs, InAsP, and multi-layer semiconductor hetero-structure quantum well, and semiconductor materials and so on.

Although the Hall current sensor has better accuracy, it requires a semiconductor wafer 113A. If the electronic apparatus 200A comprises a plurality of inputs and outputs, it would require a plurality of the semiconductor wafers 113A, and the whole circuit of the electronic apparatus 200A would be costly.

SUMMARY OF THE INVENTION

According to one aspect of the invention, there is provided a current detecting apparatus connectable to an electronic apparatus to measure a magnitude of an input current or a magnitude of an output current of the electronic apparatus. The current detecting apparatus includes a current sensing module, a direct-current measurement module and a current detecting module. The current sensing module includes a coil configured to electromagnetically couple to a path of an input of the electronic apparatus to sense the input current and obtain a first input voltage signal, and further configured to electromagnetically couple to a path of an output of the electronic apparatus to sense the output current to obtain a first output voltage signal. The direct-current measurement module is configured to measure the input current at an input inductor of the electronic apparatus to obtain a second input voltage signal, and is further configured to measure the output current at an output inductor of the electronic apparatus to obtain a second output voltage signal. The current detecting module is connected to the coil and the direct-current measurement module. The current detecting module is configured to convert the first input voltage signal into a first input current command; convert the second input voltage signal into a second input current command; convert the first output voltage signal into a first output current command; and convert the second output voltage signal into a second output current command. The current detecting module is further configured to output the first input current command, the second input current command, the first output current command, and the second output current command, to a control unit of the electronic apparatus. The first input current command is an alternating-current component of the input current. The first output current command is an alternating-current component of the output current. The second input current command is a direct-current component of the input current. The second output current command is a direct-current component of the output current.

According to another aspect of the present invention, there is provided an operation method for a current detecting apparatus. The operation method measures a magnitude of an input current or a magnitude of an output current of an electronic apparatus. The operation method comprises following steps. Step (a1) providing a current sensing module to sense the input current of the electronic apparatus to obtain a first input voltage signal, wherein the first input voltage signal is obtained by applying a differential operation to an alternating-current component of the input current and the input current is amplified or reduced in corresponding proportion to obtain the first input voltage signal; or step (a2) providing a current detecting module to sense the output current of the electronic apparatus to obtain a first output voltage signal, wherein the first output voltage signal is obtained by applying a differential operation to an alternating-current component of the output current and the output current is amplified or reduced in corresponding proportion to obtain the first output voltage signal. Step (b) sensing the input current to obtain a second input voltage signal, or sensing the output current to obtain a second output voltage signal. Step (c) performing an integral and gain adjusting operation on the first input voltage signal to generate a first input current command, or performing an integral and gain adjusting operation on the first output voltage signal to generate a first output current command. Step (d) gain-adjusting and filtering the second input voltage signal to obtain a second input current command, or gain-adjusting and filtering the second output voltage signal to obtain a second output current command. Step (e) outputting the first input current command and the second input current command to a control unit of the electronic apparatus, or outputting the first output current command and the second output current command to the control unit of the electronic apparatus.

DETAILED DESCRIPTION OF THE INVENTION

Figure 2A:
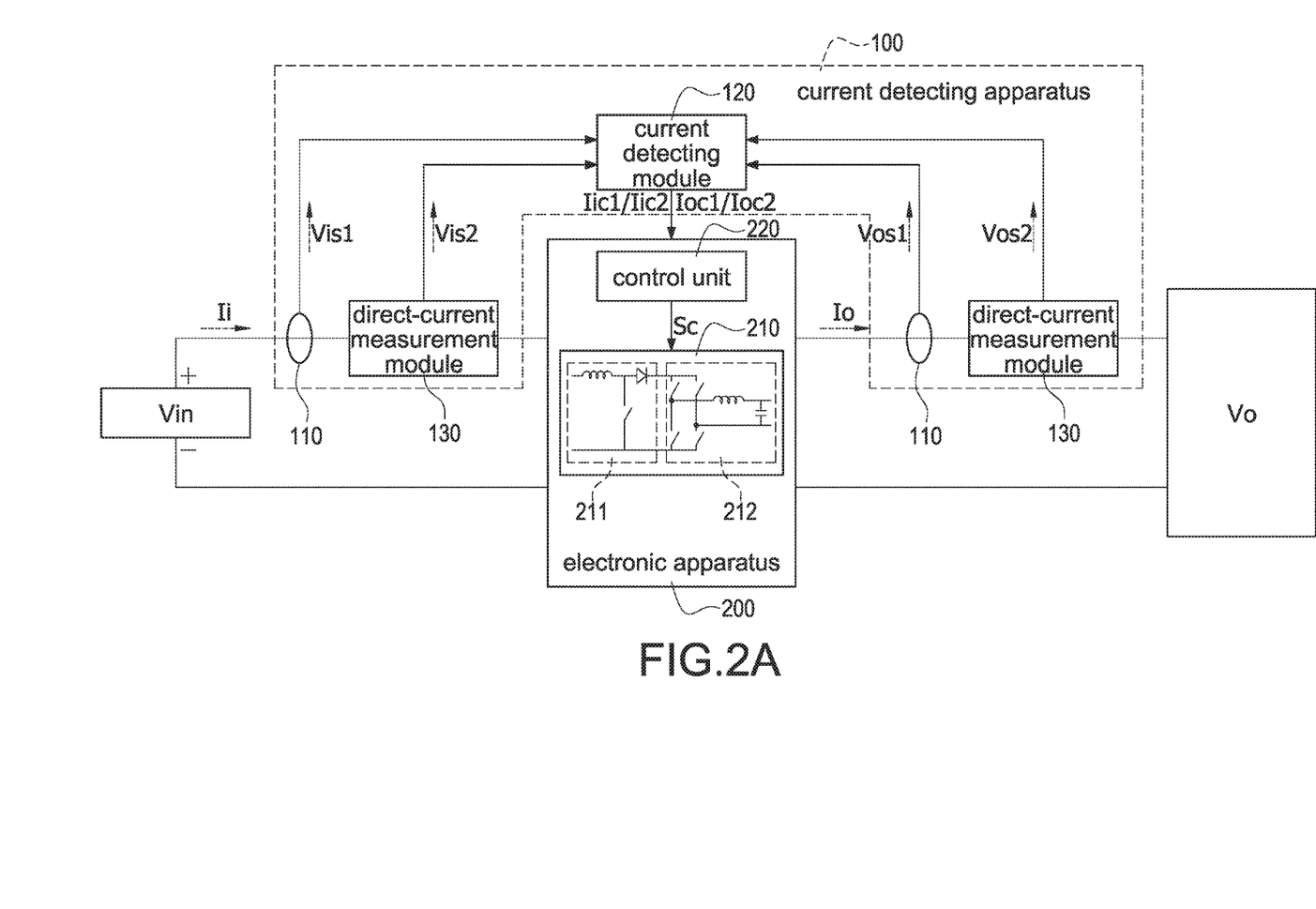
FIG. 2A shows a block diagram of a current detecting apparatus according to an embodiment of the present invention.

Referring to FIG. 2A, a current detecting apparatus 100 measures an input current Ii or an output current Io of an electronic apparatus 200. The current detecting apparatus 100 includes a current sensing module 110, a current detecting module 120 and a direct-current measurement module 130. The current detecting module 120 is electrically connected to the current sensing module 110 and the direct-current measurement module 130. Taking the input current Ii as an example, when the input current Ii flows through the current sensing module 110 and the direct-current measurement module 130, the current sensing module 110 senses the input current Ii to obtain a first input voltage signal Vis1. The direct-current measurement module 130 measures the input current Ii to obtain a second input voltage signal Vis2. The current detecting module 120 receives the first input voltage signal Vis1 and the second input voltage signal Vis2, and converts the first input voltage signal Vis1 into a first input current command Iic1, and converts the second input voltage signal Vis2 into a second input current command Iic2. When the output current Io flows through the current sensing module 110 and the direct-current measurement module 130, the current sensing module 110 senses the output current Io to obtain a first output voltage signal Vos1, and the direct-current measurement module 130 measures the output current Io to obtain a second output voltage signal Vos2. The current detecting module 120 receives the first output voltage signal Vos1 and the second output voltage signal Vos2, and converts the first output voltage signal Vos1 into a first output current command Ioc1, and converts the second output voltage signal Vos2 into a second output current command Ioc2. The current sensing module 110 and the direct-current measurement module 130 of the current detecting apparatus 100 can measure the input current Ii of the electronic apparatus 200 separately, or can measure the output current Io of the electronic apparatus 200 separately, or can measure both the input current Ii and the output current Io of the electronic apparatus 200 at the same time.

The electronic apparatus 200 comprises an input Vin and an output Vo. The electronic apparatus 200 comprises a conversion module 210 and a control unit 220 inside the electronic apparatus 200. The control unit 220 controls the conversion module 210 by a control signal Sc, so that the conversion module 210 converts an input voltage inputted from the input Vin into an output voltage, and then the conversion module 210 outputs the output voltage to the output Vo. The current sensing module 110 and the direct-current measurement module 130 are arranged at paths of the input Vin and the output Vo to measure the input current Ii and the output current Io.

Taking the input Vin as an example, the current sensing module 110 utilizes a coil configured to electromagnetically couple to the path of the input Vin to sense the input current Ii to obtain a first input voltage signal Vis1. The first input voltage signal Vis1 is obtained by applying a differential operation to an alternating-current component of the input current Ii. Then the sensing result is sent to the current detecting module 120. The current detecting module 120 converts the first input voltage signal Vis1 into the first input current command Iic1. The first input current command Iic1 is a signal corresponding to the alternating-current component of the input current Ii. The current detecting apparatus 100 further comprises the direct-current measurement module 130 to sense the input current Ii to obtain the second input voltage signal Vis2. Then the sensing result is sent to the current detecting module 120. The current detecting module 120 converts the second input voltage signal Vis2 into the second input current command Iic2. The second input current command Iic2 is a signal corresponding to the direct-current component of the input current Ii. The current detecting module 120 outputs the first input current command Iic1 and the second input current command Iic2 to the control unit 220 of the electronic apparatus 200. The control unit 220 adjusts the control signal Sc according to the first input current command Iic1 and the second input current command Iic2, and then outputs the control signal Sc to the conversion module 210. The first input current command Iic1 added to the second input current command Iic2 makes a signal, wherein the input current Ii is amplified or reduced in relative proportion to obtain the signal.

Referring to the sensing of the current of the output Vo, the current sensing module 110 senses and obtains the first output voltage signal Vos1. The first output voltage signal Vos1 is obtained by applying a differential operation to an alternating-current component of the output current Io. The current detecting module 120 converts the first output voltage signal Vos1 into a first output current command Ioc1. The first output current command Ioc1 is a signal corresponding to the alternating-current component of the output current Io. The direct-current measurement module 130 measures and obtains the second output voltage signal Vos2 of the output current Io. The current detecting module 120 converts the second output voltage signal Vos2 into a second output current command Ioc2. The second output current command Ioc2 is a signal corresponding to the direct-current component of the output current Io. The current detecting module 120 outputs the first output current command Ioc1 and the second output current command Ioc2 to the control unit 220 of the electronic apparatus 200. The control unit 220 adjusts the control signal Sc according to the first output current command Ioc1 and the second output current command Ioc2, and then outputs the control signal Sc to the conversion module 210. The first output current command Ioc1 added to the second output current command Ioc2 makes a signal, wherein the output current Io is amplified or reduced in the relative proportion to obtain the signal.

Figure 2B:
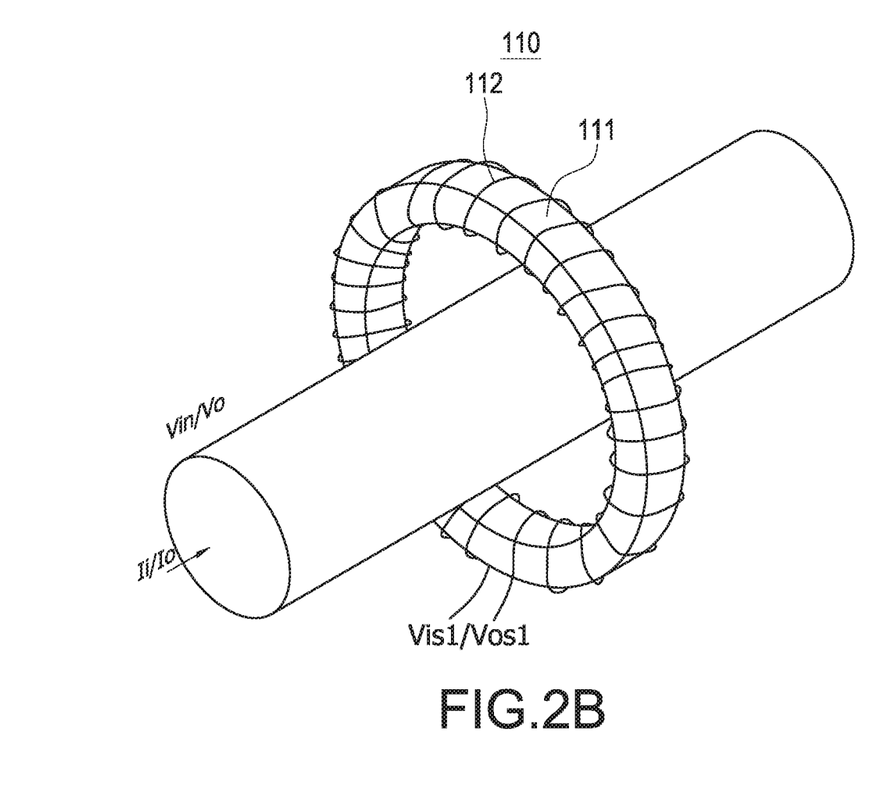
FIG. 2B shows a structure diagram of a current sensing module according to an embodiment of the present invention.

Referring to FIG. 2B together with FIG. 2A, the current sensing module 110 comprises a framework 111 and a coil 112 surrounding the framework 111. The framework 111 surrounds the paths of the input Vin or the output Vo of the electronic apparatus 200. When the framework 111 surrounds the path of the input Vin of the electronic apparatus 200, the coil 112 electromagnetic induction senses the input current Ii to obtain the first input voltage signal Vis1. When the framework 111 surrounds the path of the output Vo of the electronic apparatus 200, the coil 112 electromagnetic induction senses the output current Io to obtain the first output voltage signal Vos1. The current sensing module 110 does not utilize any semiconductor components and may allow the cost of the whole circuit of the electronic apparatus 200 to be reduced. The framework 111 may be made of magnetic materials, such as a ring core, or non-magnetic materials, such as a Rogowski coil. In this embodiment, mainly the coil 112 electromagnetically inducts the input current or the output current, but the present invention is not limited by the material and shape of the framework 111. Any component which can achieve the effect mentioned above is envisaged.

Figure 3A:
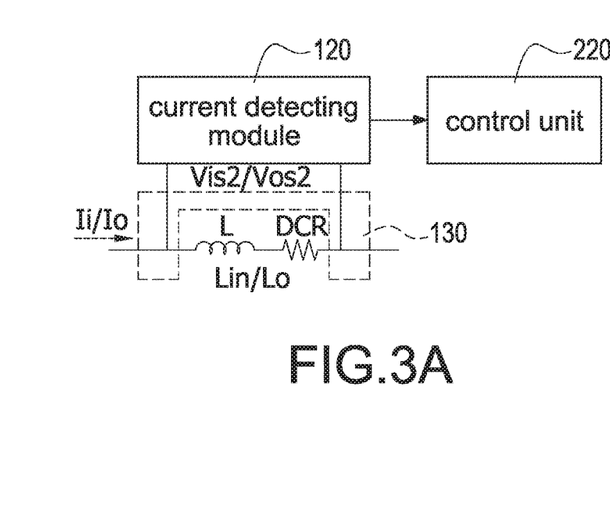
FIG. 3A shows a circuit diagram of a direct-current measurement module according to an embodiment of the present invention.

Referring to FIG. 3A together with FIG. 2A, the direct-current measurement module 130 is connected to two sides of an input inductor Lin of the electronic apparatus 200 (or connected to two sides of an output inductor Lo) and two wire lines of the current detecting module 120. When the direct-current measurement module 130 is connected to two sides of the input inductor Lin of the electronic apparatus 200, the direct-current measurement module 130 measures the input current Ii to obtain the second input voltage signal Vis2 at a connection point of the electronic apparatus 200. When the direct-current measurement module 130 is connected to two sides of the output inductor Lo of the electronic apparatus 200, the direct-current measurement module 130 measures the output current Io to obtain the second output voltage signal Vos2 at a connection point of the electronic apparatus 200. The direct-current measurement module 130 sends the second input voltage signal Vis2 or the second output voltage signal Vos2 to the current detecting module 120. The current detecting module 120 converts the second input voltage signal Vis2 into the second input current command Iic2. The current detecting module 120 converts the second output voltage signal Vos2 into the second output current command Ioc2. The current detecting module 120 outputs the second input current command Iic2 or the second output current command Ioc2 to the control unit 220.

Figure 3B:
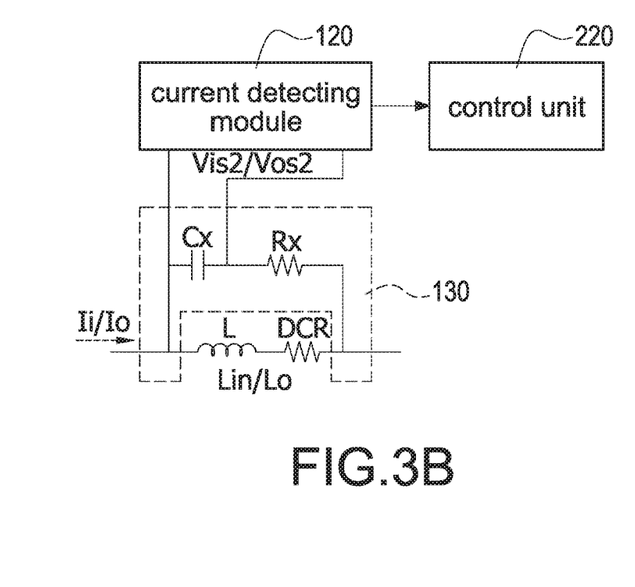
FIG. 3B shows a circuit diagram of a direct-current measurement module according to an embodiment of the present invention.

Referring to FIG. 3B together with FIG. 2A, the direct-current measurement module 130 comprises a direct-current measurement capacitor Cx and a direct-current measurement resistor Rx. Taking the input Vin as an example, one side of the direct-current measurement capacitor Cx is connected to one side of the input inductor Lin of the electronic apparatus 200. One side of the direct-current measurement resistor Rx is connected to the other side of the direct-current measurement capacitor Cx. The other side of the direct-current measurement resistor Rx is connected to the other side of the input inductor Lin of the electronic apparatus 200. Two sides of the direct-current measurement capacitor Cx are connected to the current detecting module 120 to measure and obtain the second input voltage signal Vis2 to send the second input voltage signal Vis2 to the current detecting module 120. The current detecting module 120 converts the second input voltage signal Vis2 into the second input current command Iic2, and outputs the second input current command Iic2 to the control unit 220. The circuit structure of the direct-current measurement module 130 for the output Vo is similar to that of the input Vin. One side of the direct-current measurement capacitor Cx is connected to one side of the output inductor Lo of the electronic apparatus 200. One side of the direct-current measurement resistor Rx is connected to the other side of the direct-current measurement capacitor Cx. The other side of the direct-current measurement resistor Rx is connected to the other side of the output inductor Lo of the electronic apparatus 200. Two sides of the direct-current measurement capacitor Cx are connected to the current detecting module 120 to measure and then obtain the second output voltage signal Vos2 to send the second output voltage signal Vos2 to the current detecting module 120. The current detecting module 120 converts the second output voltage signal Vos2 into the second output current command Ioc2, and outputs the second output current command Ioc2 to the control unit 220.

As shown in FIG. 3A and FIG. 3B, the input inductor Lin or the output inductor Lo of the electronic apparatus 200 comprises an equivalent inductor L and a direct-current equivalent impedance DCR. When the current flows through the input inductor Lin or the output inductor Lo of the electronic apparatus 200, a voltage drop is at the equivalent inductor L and the direct-current equivalent impedance DCR. The current detecting module 120 converts the second input voltage signal Vis2 into the second input current command Iic2, and converts the second output voltage signal Vos2 into the second output current command Ioc2. The second input current command Iic2 and the second output current command Ioc2 are mainly converted from the voltage at the direct-current equivalent impedance DCR. Therefore, the second input current command Iic2 corresponds to the direct-current component of the current at the input inductor Lin of the electronic apparatus 200. The second output current command Ioc2 corresponds to the direct-current component of the current at the output inductor Lo of the electronic apparatus 200. The input inductor Lin can be an inductor of a boost conversion module of the electronic apparatus 200. The output inductor Lo can be an output filtering inductor of the electronic apparatus 200. Therefore, no extra resistor is required to detect the current, and there is no extra loss.

Figure 4:
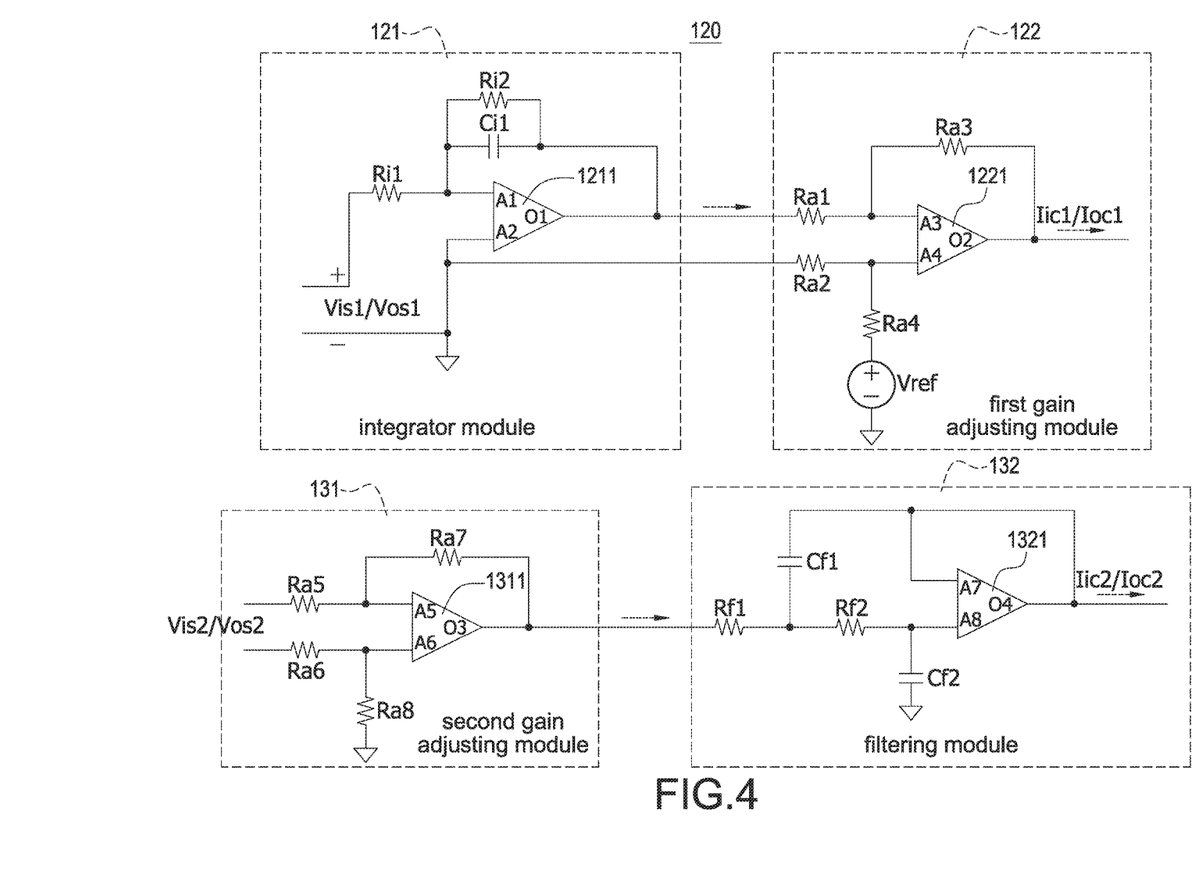
FIG. 4 shows a circuit diagram of a current detecting module according to an embodiment of the present invention.

Referring to FIG. 4 together with FIGS. 2A to 3B, the current detecting module 120 comprises an integrator module 121, a first gain adjusting module 122, a second gain adjusting module 131 and a filtering module 132. The integrator module 121 is connected to the coil 112 and converts the first input voltage signal Vis1. The first input voltage signal Vis1 is obtained by applying a differential operation to the alternating-current component of the input current Ii at the input Vin. The first gain adjusting module 122 is connected to the integrator module 121. The first gain adjusting module 122 adjusts the gain of the signal which has been processed by the integrator module 121 to obtain the first input current command Iic1. As shown in FIG. 4, the integrator module 121 comprises a first integrator resistor Ri1, a first amplifier unit 1211, a second integrator resistor Ri2 and a first integrator capacitor Ci1. One side of the first integrator resistor Ri1 is connected to one side of the coil 112. The first amplifier unit 1211 comprises a first input A1, a second input A2 and a first output O1. The first input A1 is connected to the other side of the first integrator resistor Ri1. The second input A2 is connected between the other side of the coil 112 and a ground. One side of the second integrator resistor Ri2 is connected to the first input A1. The other side of the second integrator resistor Ri2 is connected to the first output O1. One side of the first integrator capacitor Ci1 is connected to the first input A1. The other side of the first integrator capacitor Ci1 is connected to the first output O1. The first gain adjusting module 122 comprises a first gain adjusting resistor Ra1, a second gain adjusting resistor Ra2, a second amplifier unit 1221, a third gain adjusting resistor Ra3 and a fourth gain adjusting resistor Ra4. One side of the first gain adjusting resistor Ra1 is connected to the first output O1. One side of the second gain adjusting resistor Ra2 is connected to the second input A2. The second amplifier unit 1221 comprises a third input A3, a fourth input A4 and a second output O2. The third input A3 is connected to the other side of the first gain adjusting resistor Ra1. The fourth input A4 is connected to the other side of the second gain adjusting resistor Ra2. One side of the third gain adjusting resistor Ra3 is connected to the third input A3. The other side of the third gain adjusting resistor Ra3 is connected to the second output O2. One side of the fourth gain adjusting resistor Ra4 is connected to the fourth input A4. The other side of the fourth gain adjusting resistor Ra4 is connected to a reference voltage Vref.

The circuit structure of the current detecting module 120, the integrator module 121 and the first gain adjusting module 122 for the output Vo is similar to the circuit structure for the input Vin, and is not repeated here for brevity. Moreover, in this embodiment, the integrator module 121 and the first gain adjusting module 122 are not limited by the circuit structure described above. For example, the second integrator resistor Ri2 can be removed from the integrator module 121, and the first gain adjusting module 122 can be a differential amplifier circuit which comprises transistors. Any circuit structure which can carry out integral or gain adjusting operation is envisaged.

As mentioned above, the current detecting module 120 comprises the second gain adjusting module 131 and the filtering module 132. The current detecting module 120 converts the second input voltage signal Vis2 into the second input current command Iic2, wherein the second input voltage signal Vis2 corresponds with the input current Ii at the input inductor Lin. The second input current command Iic2 is the signal corresponding to the direct-current component of the input current Ii. The second gain adjusting module 131 comprises a fifth gain adjusting resistor Ra5, a sixth gain adjusting resistor Ra6, a third amplifier unit 1311, a seventh gain adjusting resistor Ra7 and an eighth gain adjusting resistor Ra8. One side of the fifth gain adjusting resistor Ra5 is connected to one side of the input inductor Lin of the electronic apparatus 200 or one side of the direct-current measurement capacitor Cx. One side of the sixth gain adjusting resistor Ra6 is connected to the other side of the input inductor Lin of the electronic apparatus 200 or the other side of the direct-current measurement capacitor Cx. The third amplifier unit 1311 comprises a fifth input A5, a sixth input A6 and a third output O3. The fifth input A5 is connected to the other side of the fifth gain adjusting resistor Ra5. The sixth input A6 is connected to the other side of the sixth gain adjusting resistor Ra6. One side of the seventh gain adjusting resistor Ra7 is connected to the fifth input A5. The other side of the seventh gain adjusting resistor Ra7 is connected to the third output O3. One side of the eighth gain adjusting resistor Ra8 is connected to the sixth input A6. The other side of the eighth gain adjusting resistor Ra8 is connected to ground. The filtering module 132 comprises a first filtering resistor Rf1, a second filtering resistor Rf2, a first filtering capacitor Cf1, a fourth amplifier unit 1321 and a second filtering capacitor Cf2. One side of the first filtering resistor Rf1 is connected to the third output O3. One side of the second filtering resistor Rf2 is connected to the other side of the first filtering resistor Rf1. One side of the first filtering capacitor Cf1 is connected to the other side of the first filtering resistor Rf1. The fourth amplifier unit 1321 comprises a seventh input A7, an eighth input A8 and a fourth output O4. The seventh input A7 and the fourth output O4 are connected to the other side of the first filtering capacitor Cf1. The eighth input A8 is connected to the other side of the second filtering resistor Rf2. One side of the second filtering capacitor Cf2 is connected to the eighth input A8. The other side of the second filtering capacitor Cf2 is connected to a ground. The circuit structure of the current detecting module 120, the second gain adjusting module 131 and the filtering module 132 for the output Vo is similar to the circuit structure for the input Vin, and is not repeated here for brevity. The second gain adjusting module 131 and the filtering module 132 are not limited by the circuit structure mentioned above. For example, the second gain adjusting module 131 can be a differential amplifier circuit which comprises transistors. The filtering module 132 can be a low pass filter, so that various low pass filters can be used according to the desired requirement. Therefore, any circuit structure which can carry out gain adjusting or filtering operation is envisaged.

Referring to FIG. 4 together with FIGS. 2A to 3B, taking the input Vin as an example, when the current sensing module 110 and the direct-current measurement module 130 measure the input current Ii of the electronic apparatus 200, the current sensing module 110 electromagnetically inducts to output the first input voltage signal Vis1. A differential operation is applied to the alternating-current component of the input current Ii and it is amplified or reduced in relative proportion to obtain the first input voltage signal Vis1. The integrator module 121 of the current detecting module 120 integrates the first input voltage signal Vis1 to restore and obtain a current signal, wherein the current signal is the alternating-current component of the input current Ii amplified or reduced in relative proportion. The first gain adjusting module 122 adjusts the gain of the current signal. After adjusting a level according to the reference voltage Vref, the first input current command Iic1 is outputted. The first input current command Iic1 is the alternating-current component of the input current Ii. The direct-current measurement module 130 outputs the second input voltage signal Vis2 in accordance with the input current Ii. The second gain adjusting module 131 adjusts the gain of the second input voltage signal Vis2, and the filtering module 132 filters out the high frequency components. The second input current command Iic2, which is the direct-current component of the input current Ii, is outputted. The current detecting module 120 outputs the first input current command Iic1 and the second input current command Iic2 to the control unit 220. The control unit 220 adjusts the control signal Sc according to the first input current command Iic1 and the second input current command Iic2, and then outputs the control signal Sc to the conversion module 210.

The operation for the current detecting module 120 for the output Vo is similar to the operation method for the input Vin, and is not repeated here for brevity. The first gain adjusting module 122 adjusts the gain of the signal, so that the signal is amplified or reduced in relative proportion, therefore the first gain adjusting module 122 is not limited to be connected after the integrator module 121. For example, the first gain adjusting module 122 may be arranged before the integrator module 121. Moreover, the second gain adjusting module 131 is not limited to be connected before the filtering module 132. For example, the second gain adjusting module 131 may be arranged after the filtering module 132. It is also envisaged that a skilled person in this field could use any low pass filter module to achieve both filtering and adjusting the gain at the same time.

Figure 5:
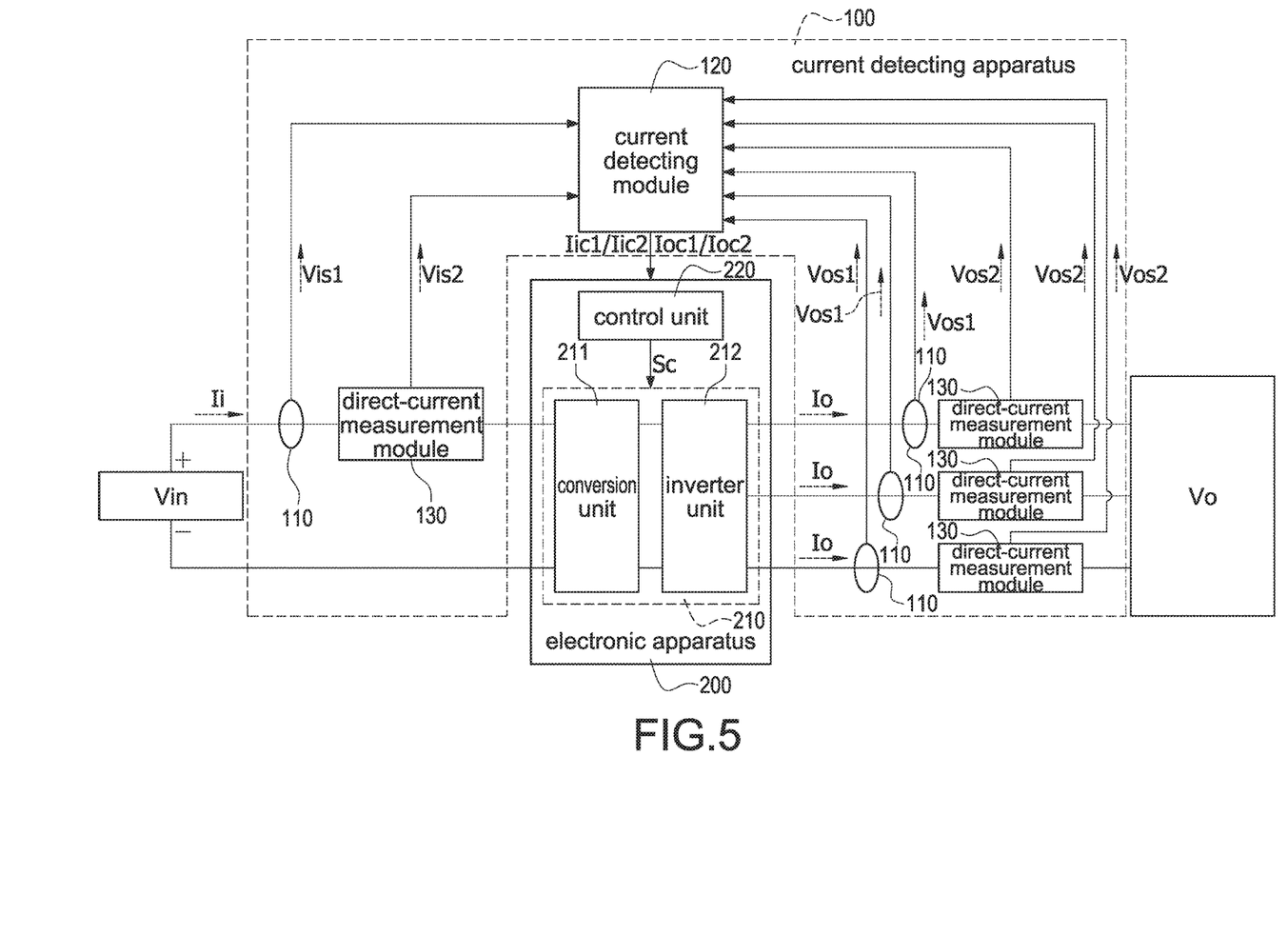
FIG. 5 shows a circuit diagram of a current detecting apparatus according to an embodiment of the present invention.

Referring to FIG. 5 together with FIGS. 2A to 4, another embodiment of the current detecting apparatus 100 is an extended application of the previously described embodiments. As shown, the electronic apparatus 200 comprises a conversion module 210 and a control unit 220, and the conversion module 210 comprises a conversion unit 211 connected to an inverter unit 212. The control unit 220 controls the conversion unit 211 and the inverter unit 212 using a control signal Sc. The input to the conversion unit 211 is one-phase, and a current sensing module 110 and a direct-current measurement module 130 are arranged at the input Vin for detecting the input current Ii. The output of the inverter unit 212 is three-phase, and a current sensing module 110 and a direct-current measurement module 130 are arranged at each of the three phase output Vo for detecting the output current Io. The current detecting module 120 is configured to receive the first input voltage signal Vis1 and the second input voltage signal Vis2 obtained by the current sensing module 110 and the direct-current measurement module 130, and converts the first input voltage signal Vis1 and the second input voltage signal Vis2 into the first input current command Iic1 and the second input current command Iic2. The current detecting modules 120 is configured to receive the three first output voltage signals Vos1 and the three second output voltage signals Vos2 obtained by the three current sensing modules 110 and the three direct-current measurement modules 130 respectively, and converts the signals into the first output current command Ioc1 and the second output current command Ioc2. The control unit 220 is configured to receive the first input current command Iic1; the second input current command Iic2; the first output current command Ioc1; and the second output current command Ioc2, and according to the first input current command Iic1; the second input current command Iic2; the first output current command Ioc1; and the second output current command Ioc2, the control unit 220 adjusts the control signal Sc.

The three direct-current measurement modules 130 sense three different first output voltage signals Vos1 and three different second output voltage signals Vos2. The current detecting module 120 receives the single first input voltage signal Vis1 and the single second input voltage signal Vis2 at the input Vin, and receives the three first output voltage signals Vos1 and the three second output voltage signals Vos2. Therefore, four integrator modules 121, four first gain adjusting modules 122, four second gain adjusting modules 131 and four filtering modules 132 are arranged in the current detecting module 120 to process the first input voltage signal Vis1, the second input voltage signal Vis2, the three first output voltage signals Vos1 and the three second output voltage signals Vos2. It is envisaged that the quantity of the inputs and the quantity of the outputs of the electronic apparatus 200 could be any combination, for example but not limited to, three inputs and single output, or multiple inputs and multiple outputs.

Figure 6:
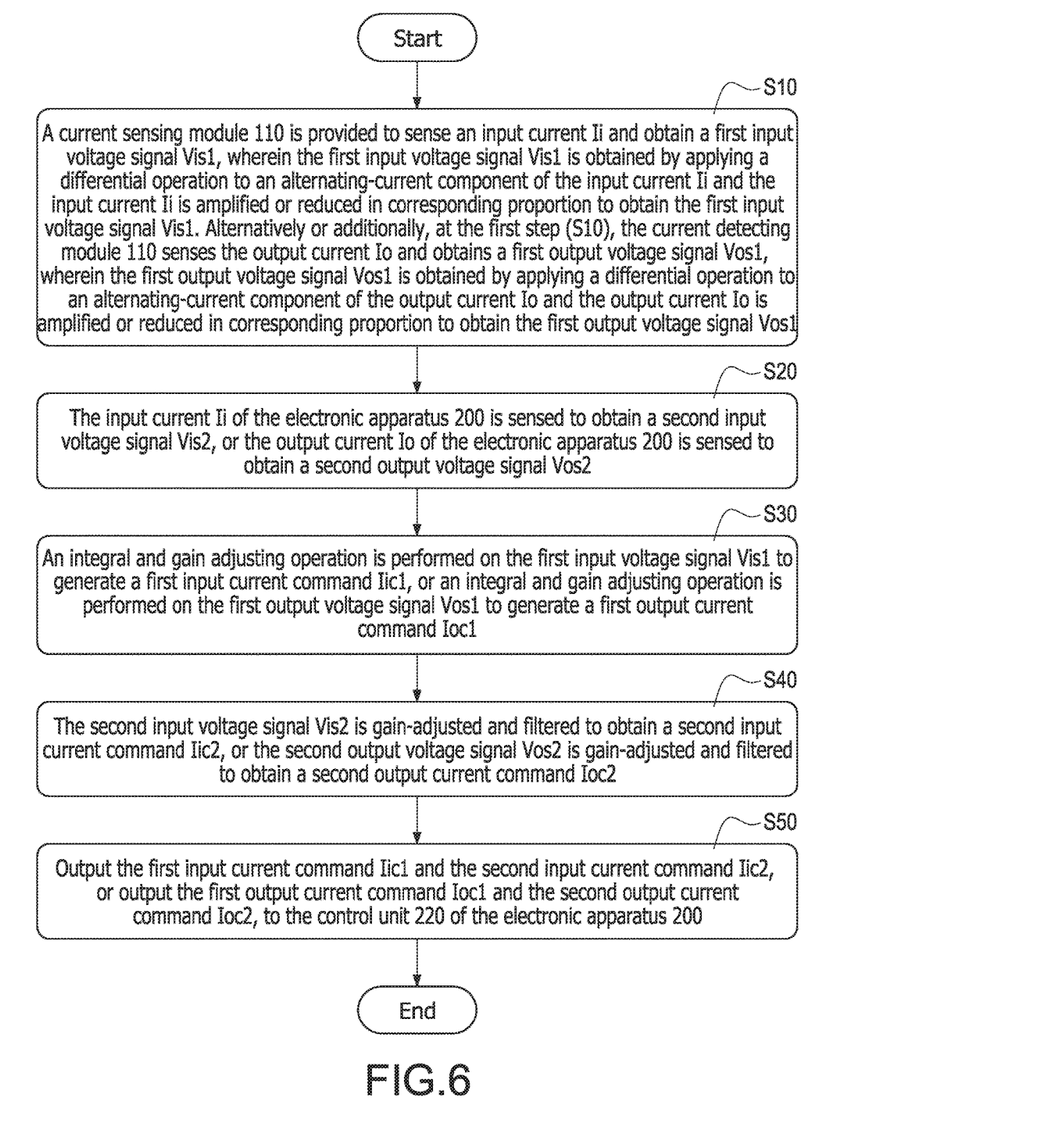
FIG. 6 shows a flow chart of an operation method for a current detecting apparatus according to an embodiment of the present invention.

FIG. 6 shows a flow chart of an operation method according to an embodiment of the present invention. Referring to FIG. 6 together with FIGS. 4 to 5, at the first step (S10), a current sensing module 110 is provided to sense an input current Ii and obtain a first input voltage signal Vis1, wherein the first input voltage signal Vis1 is obtained by applying a differential operation to an alternating-current component of the input current Ii and the input current Ii is amplified or reduced in corresponding proportion to obtain the first input voltage signal Vis1. Alternatively or additionally, at the first step (S10), the current detecting module 110 senses the output current Io and obtains a first output voltage signal Vos1, wherein the first output voltage signal Vos1 is obtained by applying a differential operation to an alternating-current component of the output current Io and the output current Io is amplified or reduced in corresponding proportion to obtain the first output voltage signal Vos1.

A framework 111 of the current sensing module 110 surrounds a path of an input Vin or a path of an output Vo of the electronic apparatus 200. Currents on the path of the input Vin or the path of the output Vo of the electronic apparatus 200 are sensed by a coil 112 of the framework 111 to obtain the first input voltage signal Vis1 or the first output voltage signal Vos1.

The next step (S20), the input current Ii of the electronic apparatus 200 is sensed to obtain a second input voltage signal Vis2, or the output current Io of the electronic apparatus 200 is sensed to obtain a second output voltage signal Vos2.

The direct-current measurement module 130 is connected to two sides of an input inductor Lin of the electronic apparatus 200 to measure the input current Ii and obtain the second input voltage signal Vis2, or the direct-current measurement module 130 is connected to two sides of an output inductor Lo of the electronic apparatus 200 and the current detecting module 120 to measure the output current Io and obtain the second output voltage signal Vos2.

The next step (S30), an integral and gain adjusting operation is performed on the first input voltage signal Vis1 to generate a first input current command Iic1, or an integral and gain adjusting operation is performed on the first output voltage signal Vos1 to generate a first output current command Ioc1.

The current detecting apparatus 100 performs integral operation on the first input voltage signal Vis1 or the first output voltage signal Vos1 using an integrator module 121 and performs gain adjusting operation using a first gain adjusting module 122, to obtain the first input current command Iic1 or the first output current command Ioc1.

The next step (S40), the second input voltage signal Vis2 is gain-adjusted and filtered to obtain a second input current command Iic2, or the second output voltage signal Vos2 is gain-adjusted and filtered to obtain a second output current command Ioc2.

The current detecting apparatus 100 adjusts the gain of the second input voltage signal Vis2 or the second output voltage signal Vos2 using a second gain adjusting module 131, and filters using a filtering module 132, to obtain the second input current command Iic2 or the second output current command Ioc2.

The next step (S50), output the first input current command Iic1 and the second input current command Iic2, or output the first output current command Ioc1 and the second output current command Ioc2, to the control unit 220 of the electronic apparatus 200.

The electronic apparatus 200 is controlled by the control signal Sc which is adjusted according to the first input current command Iic1, the first output current command Ioc1, the second input current command Iic2 and the second output current command Ioc2.

In summary, the following advantages may be attained:

1. A current detecting apparatus having simple structures is used to measure the input or output current to replace the Hall current sensor to reduce the cost.

2. A current sensing module and a direct-current measurement module arranged to measure an alternating-current component and a direct-current component of the input or the output to increase the accuracy of the measurement.

Although the present invention has been described with reference to the preferred embodiment thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A current detecting apparatus connectable to an electronic apparatus to measure a magnitude of an input current or a magnitude of an output current of the electronic apparatus, the current detecting apparatus comprising:
a current sensing module comprising a coil configured to electromagnetically couple to a path of an input of the electronic apparatus to sense the input current and obtain a first input voltage signal, and further configured to electromagnetically couple to a path of an output of the electronic apparatus to sense the output current to obtain a first output voltage signal;
a direct-current measurement module configured to measure the input current at an input inductor of the electronic apparatus to obtain a second input voltage signal, and further configured to measure the output current at an output inductor of the electronic apparatus to obtain a second output voltage signal; and
a current detecting module connected to the coil and the direct-current measurement module,
the current detecting module being configured to convert the first input voltage signal into a first input current command; convert the second input voltage signal into a second input current command; convert the first output voltage signal into a first output current command; and convert the second output voltage signal into a second output current command,
the current detecting module being further configured to output the first input current command; the second input current command; the first output current command; and the second output current command to a control unit of the electronic apparatus,
wherein the first input current command is an alternating-current component of the input current; the first output current command is an alternating-current component of the output current; the second input current command is a direct-current component of the input current; and the second output current command is a direct-current component of the output current.

2. The current detecting apparatus of claim 1, wherein the first input voltage signal is a differential signal corresponding with the alternating-current component of the input current, and the first output voltage signal is a differential signal corresponding with the alternating-current component of the output current.

3. The current detecting apparatus of claim 1, wherein the current detecting module comprises:

an integrator module connected to the coil;
a first gain adjusting module connected between the integrator module and the control unit;
a second gain adjusting module connected to the direct-current measurement module; and
a filtering module connected between the second gain adjusting module and the control unit.

4. The current detecting apparatus of claim 3, wherein the integrator module is configured to perform an integration operation on the first input voltage signal or the first output voltage signal, and wherein the first gain adjusting module is configured to perform a gain adjusting operation to generate the first input current command or the first output current command.

5. The current detecting apparatus of claim 3, wherein the second gain adjusting module is configured to gain-adjust the second input voltage signal or the second output voltage signal, and the filtering module is configured to filter and generate the second input current command or the second output current command.

6. The current detecting apparatus of claim 3, wherein the integrator module comprises:
a first integrator resistor comprising one side of the first integrator resistor connected to one side of the coil;
a first amplifier unit comprising a first input, a second input and a first output, the first input connected to an other side of the first integrator resistor, a second input connected between the other side of the coil and a ground;
a second integrator resistor comprising one side of the second integrator resistor connected to the first input, and an other side of the second integrator resistor connected to the first output; and
a first integrator capacitor comprising one side of the first integrator capacitor connected to the first input, and an other side of the first integrator capacitor connected to the first output.

7. The current detecting apparatus of claim 6, wherein the first gain adjusting module comprises:
a first gain adjusting resistor comprising one side of the first gain adjusting resistor connected to the first output;
a second gain adjusting resistor comprising one side of the second gain adjusting resistor connected to the second input;
a second amplifier unit comprising a third input, a fourth input and a second output, the third input connected to an other side of the first gain adjusting resistor, a fourth input connected to an other side of the second gain adjusting resistor;
a third gain adjusting resistor comprising one side of the third gain adjusting resistor connected to the third input, and an other side of the third gain adjusting resistor connected to the second output; and
a fourth gain adjusting resistor comprising one side of the fourth gain adjusting resistor connected to the fourth input, and an other side of the fourth gain adjusting resistor connected to a reference voltage.

8. The current detecting apparatus of claim 3, wherein the direct-current measurement module is connected to the current detecting module, wherein the direct-current measurement module is further configured to connect to two sides of the input inductor or two sides of the output inductor of the electronic apparatus.

9. The current detecting apparatus of claim 3, wherein the direct-current measurement module comprises:
a direct-current measurement capacitor comprising one side of the direct-current measurement capacitor configured to connect to one side of the input inductor or one side of the output inductor of the electronic apparatus; and a direct-current measurement resistor comprising one side of the direct-current measurement resistor configured to connect to an other side of the direct-current measurement capacitor, an other side of the direct-current measurement resistor connected to the other side of the input inductor, or an other side of the output inductor of the electronic apparatus, wherein two sides of the direct-current measurement capacitor are connected to the current detecting module.

10. The current detecting apparatus of claim 8, wherein the second gain adjusting module comprises:
 a fifth gain adjusting resistor comprising one side of the fifth gain adjusting resistor configured to connect to one side of the input inductor or one side of the output inductor of the electronic apparatus;
 a sixth gain adjusting resistor comprising one side of the sixth gain adjusting resistor configured to connect to an other side of the input inductor or an other side of the output inductor of the electronic apparatus;
 a third amplifier unit comprising a fifth input, a sixth input and a third output, the fifth input connected to an other side of the fifth gain adjusting resistor, a sixth input connected to an other side of the sixth gain adjusting resistor;
 a seventh gain adjusting resistor comprising one side of the seventh gain adjusting resistor connected to the fifth input, and an other side of the seventh gain adjusting resistor connected to the third output; and
 an eighth gain adjusting resistor comprising one side of the eighth gain adjusting resistor connected to the sixth input, and an other side of the eighth gain adjusting resistor connected to a ground.

11. The current detecting apparatus of claim 10, wherein the filtering module comprises:
 a first filtering resistor comprising one side of the first filtering resistor connected to the third output;
 a second filtering resistor comprising one side of the second filtering resistor connected to an other side of the first filtering resistor;
 a first filtering capacitor comprising one side of the first filtering capacitor connected to the other side of the first filtering resistor;
 a fourth amplifier unit comprising a seventh input, an eighth input and a fourth output, wherein the seventh input and the fourth output are connected to an other side of the first filtering capacitor, wherein the eighth input is connected to an other side of the second filtering resistor; and
 a second filtering capacitor comprising one side of the second filtering capacitor connected to the eighth input, and an other side of the second filtering capacitor connected to a ground.

12. The current detecting apparatus of claim 9, wherein the second gain adjusting module comprises:
 a fifth gain adjusting resistor comprising one side of the fifth gain adjusting resistor connected to the one side of the direct-current measurement capacitor;
 a sixth gain adjusting resistor comprising one side of the sixth gain adjusting resistor connected to the other side of the direct-current measurement capacitor;
 a third amplifier unit comprising a fifth input, a sixth input and a third output, the fifth input connected to the other side of the fifth gain adjusting resistor, a sixth input connected to the other side of the sixth gain adjusting resistor;
 a seventh gain adjusting resistor comprising one side of the seventh gain adjusting resistor connected to the fifth input, and an other side of the seventh gain adjusting resistor connected to the third output; and
 an eighth gain adjusting resistor comprising one side of the eighth gain adjusting resistor connected to the sixth input, and an other side of the eighth gain adjusting resistor connected to a ground.

13. The current detecting apparatus of claim 12, wherein the filtering module comprises:
 a first filtering resistor comprising one side of the first filtering resistor connected to the third output;
 a second filtering resistor comprising one side of the second filtering resistor connected to an other side of the first filtering resistor;
 a first filtering capacitor comprising one side of the first filtering capacitor connected to the other side of the first filtering resistor;
 a fourth amplifier unit comprising a seventh input, an eighth input and a fourth output, wherein the seventh input and the fourth output are connected to an other side of the first filtering capacitor, wherein the eighth input is connected to an other side of the second filtering resistor; and
 a second filtering capacitor comprising one side of the second filtering capacitor connected to the eighth input, and an other side of the second filtering capacitor connected to a ground.

14. An operation method for a current detecting apparatus measuring a magnitude of an input current or a magnitude of an output current of an electronic apparatus, the operation method comprising:
 (a1) providing a current sensing module to sense the input current of the electronic apparatus to obtain a first input voltage signal, wherein the first input voltage signal is obtained by applying a differential operation to an alternating-current component of the input current and the input current is amplified or reduced in corresponding proportion to obtain the first input voltage signal; or
 (a2) providing the current sensing module to sense the output current of the electronic apparatus to obtain a first output voltage signal, wherein the first output voltage signal is obtained by applying a differential operation to an alternating-current component of the output current and the output current is amplified or reduced in corresponding proportion to obtain the first output voltage signal; and
 (b) sensing the input current at an input inductor of the electronic apparatus to obtain a second input voltage signal, or sensing the output current at an output inductor of the electronic apparatus to obtain a second output voltage signal;
 (c) performing an integral and gain adjusting operation on the first input voltage signal to generate a first input current command, or performing an integral and gain adjusting operation on the first output voltage signal to generate a first output current command;
 (d) gain-adjusting and filtering the second input voltage signal to obtain a second input current command, or gain-adjusting and filtering the second output voltage signal to obtain a second output current command; and
 (e) outputting the first input current command and the second input current command to a control unit of the electronic apparatus, or outputting the first output current command and the second output current command to the control unit of the electronic apparatus.

* * * * *